United States Patent
Liu et al.

(10) Patent No.: US 10,347,762 B1
(45) Date of Patent: Jul. 9, 2019

(54) FIELD EFFECT TRANSISTOR CONTACT WITH REDUCED CONTACT RESISTANCE USING IMPLANTATION PROCESS

(71) Applicant: Taiwan Semiconductor Manufacturing Co., Ltd., Hsinchu (TW)

(72) Inventors: Su-Hao Liu, Jhongpu Township (TW); Kuo-Ju Chen, Taichung (TW); Chun-Hung Wu, New Taipei (TW); Chia-Cheng Chen, Hsinchu (TW); Liang-Yin Chen, Hsinchu (TW); Huicheng Chang, Tainan (TW); Ying-Lang Wang, Tien-Chung Village (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/991,570

(22) Filed: May 29, 2018

(51) Int. Cl.
| | |
|---|---|
| *H01L 27/088* | (2006.01) |
| *H01L 29/78* | (2006.01) |
| *H01L 21/02* | (2006.01) |
| *H01L 21/3115* | (2006.01) |
| *H01L 29/66* | (2006.01) |
| *H01L 21/8234* | (2006.01) |
| *H01L 29/165* | (2006.01) |
| *H01L 21/3215* | (2006.01) |

(52) U.S. Cl.
CPC .... *H01L 29/7848* (2013.01); *H01L 21/02381* (2013.01); *H01L 21/02532* (2013.01); *H01L 21/02592* (2013.01); *H01L 21/31155* (2013.01); *H01L 21/32155* (2013.01); *H01L 21/823431* (2013.01); *H01L 27/0886* (2013.01); *H01L 29/165* (2013.01); *H01L 29/66795* (2013.01); *H01L 29/785* (2013.01); *H01L 2029/7858* (2013.01)

(58) Field of Classification Search
CPC .......... H01L 29/7848; H01L 21/02381; H01L 21/32155
See application file for complete search history.

(56) References Cited

U.S. PATENT DOCUMENTS

2018/0277541 A1* 9/2018 Gluschenkov ...... H01L 27/0924

* cited by examiner

*Primary Examiner* — Elias Ullah
(74) *Attorney, Agent, or Firm* — Slater Matsil, LLP

(57) ABSTRACT

Embodiments disclosed herein relate generally to forming an ultra-shallow junction having high dopant concentration and low contact resistance in a p-type source/drain region. In an embodiment, a method includes forming a source/drain region in an active area on a substrate, the source/drain region comprising germanium, performing an ion implantation process using gallium (Ga) to form an amorphous region in the source/drain region, performing an ion implantation process using a dopant into the amorphous region, and subjecting the amorphous region to a thermal process.

20 Claims, 11 Drawing Sheets

FIELD EFFECT TRANSISTOR CONTACT WITH REDUCED CONTACT RESISTANCE USING IMPLANTATION PROCESS

BACKGROUND

As the semiconductor industry has progressed into nanometer technology process nodes in pursuit of higher device density, higher performance, and lower costs, challenges from both fabrication and design issues have resulted in the development of three-dimensional designs, such as a Fin Field Effect Transistor (FinFET). FinFET devices typically include semiconductor fins with high aspect ratios and in which channel and source/drain regions are formed. A gate is formed over and along the sides of the fin structure (e.g., wrapping) utilizing the advantage of the increased surface area of the channel to produce faster, more reliable, and better-controlled semiconductor transistor devices.

FinFET devices typically include semiconductor regions used to form source regions and drain regions. Metal silicides are then formed on the surfaces of the semiconductor regions in order to reduce the contact resistance. However, with the decreasing in scaling, new challenges are presented.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
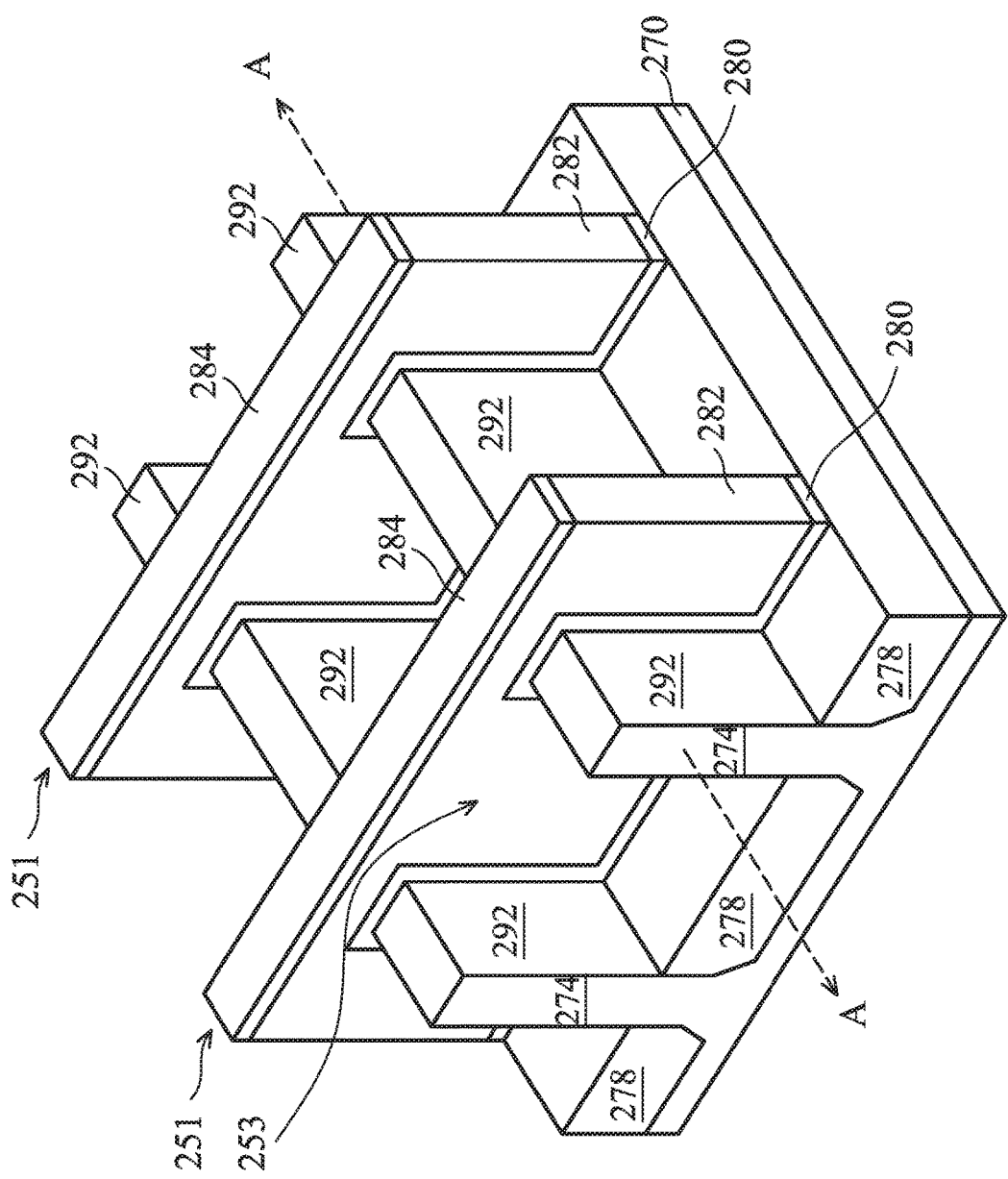
FIG. 1 illustrates a perspective view of an intermediate structure corresponding to a stage of fabrication according to some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments to be described below relate generally to using a dopant, such as gallium in some examples, for forming an amorphous region in source/drain regions for p-FET devices. Gallium is a suitable dopant for p-FET devices and has high equilibrium solid solubility and slow diffusion behavior in germanium, and in silicon germanium ($Si_xGe_1$-x) having a high concentration of germanium of about 40 atomic percent (at. %) or greater. Therefore, implanting gallium in silicon germanium can permit formation of an ultra-shallow junction with a high dopant concentration proximate a top surface of the source/drain region, thereby reducing a resistance of a contact to the source/drain region and short channel effects. In some cases, a subsequent dopant implantation process can be eliminated.

The foregoing broadly outlines some aspects of embodiments described in this disclosure. It is contemplated that the concepts of the present disclosure may be implemented for a planar transistor device or for a three-dimensional transistor device, such as the fin field effect transistors (FinFETs) described in this disclosure. Some example devices for which aspects described herein may be implemented include Horizontal Gate All Around (HGAA) FETs, Vertical Gate All Around (VGAA) FETs, nanowire channel FETs, strained-semiconductor devices, silicon-on-insulator (SOI) devices, FinFETs having fins on a crown shape (e.g., a structure shown in FIG. 11) or non-crown shape structure, or other devices that can be beneficial from the pre-treatment process to mitigate the issues associated with loading effect and/or substrate-dependent growth.

FIG. 1 illustrates an example of an intermediate structure in a three-dimensional view. FIG. 1 also illustrates a reference cross-section that is used in later figures. Fins 274 are formed on a semiconductor substrate 270. The semiconductor substrate 270 may be or include a bulk semiconductor substrate, a semiconductor-on-insulator (SOI) substrate, or the like, which may be doped (e.g., with a p-type or an n-type dopant) or undoped. In some embodiments, the semiconductor material of the semiconductor substrate 270 may include an elemental semiconductor including silicon (Si) or germanium (Ge); a compound semiconductor; an alloy semiconductor; or a combination thereof. Each fin 274 provides an active area where one or more devices are formed. The fins 274 are fabricated using suitable processes performed on the semiconductor substrate 270, including masking, photolithography, and/or etch processes, to form trenches 253 into the substrate 270, leaving the fins extended upwardly from the substrate 270. The fins 274 may be patterned by any suitable method. For example, the fins 274 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 274 and form the trenches 253.

The trenches 253 may then be filled with an insulating material such as an oxide (e.g., silicon oxide), a nitride, the like, or a combination thereof. The insulating material may be recessed, such as by using an acceptable etch process, to form the isolation regions 278. The insulating material is recessed such that the fins 274 protrude above and from between neighboring isolation regions 278.

Dummy gate structures 251 are formed on the fins 274. The dummy gate structures 251 are over and extend perpendicularly to the fins 274. Each dummy gate structure 251 includes an interfacial dielectric 280, a dummy gate 282 over the interfacial dielectric 280, and a mask 284 over the dummy gate 282. The interfacial dielectrics 280, the dummy gates 282, and the mask 284 for the dummy gate structures 251 may be formed by sequentially forming respective layers, and then patterning those layers into the dummy gate structures 251. For example, a layer for the interfacial dielectrics 280 may include or be silicon oxide, silicon nitride, the like, or multilayers thereof. A layer for the dummy gates 282 may include or be silicon (e.g., polysilicon) or another material. A layer for the masks 284 may include or be silicon nitride, silicon oxynitride, silicon carbon nitride, the like, or a combination thereof. The layers can be formed or deposited by any suitable deposition technique. The layers for the interfacial dielectrics 280, the dummy gates 282, and the mask 284 may then be patterned, for example, using photolithography and one or more etch processes, to form the interfacial dielectrics 280, the dummy gates 282, and the mask 284 for each dummy gate structure 251.

FIGS. 2-9 are schematic cross-sectional views of respective intermediate structures corresponding to various stages of fabrication and corresponding to cross-section A-A in FIG. 1. Cross-section A-A in FIG. 1 is in a plane along, e.g., channels in the fin 274 between opposing source/drain regions 292.

Figure 2:
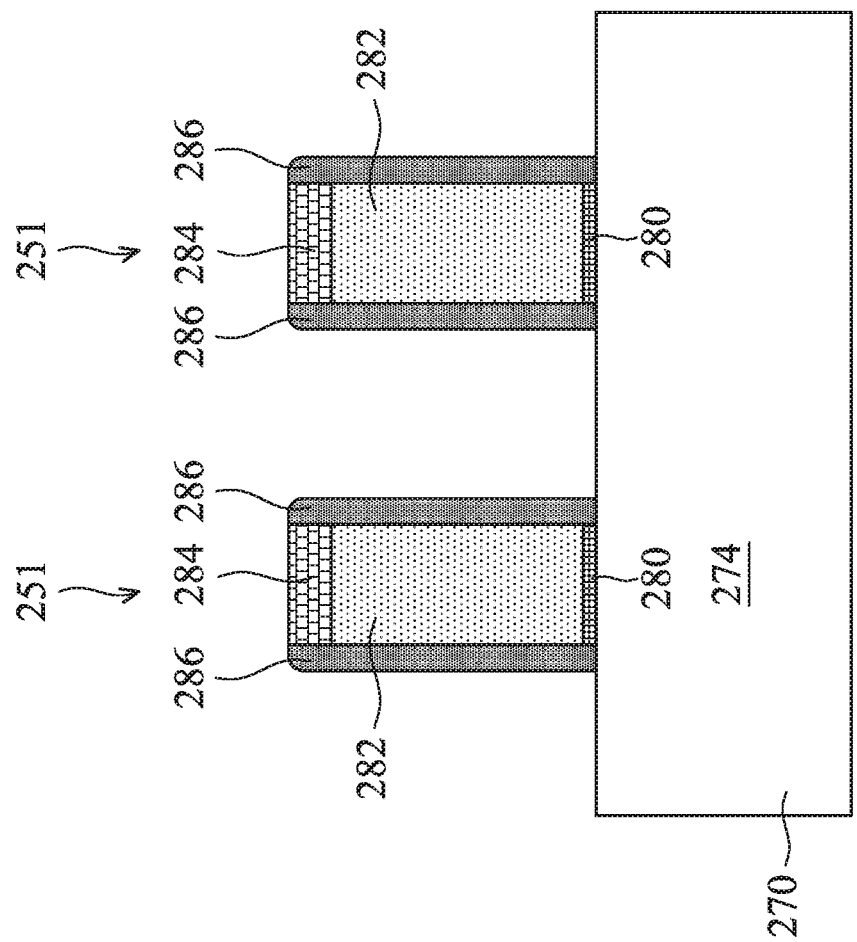
FIGS. 2-9 are schematic cross-sectional views of respective intermediate structures corresponding to various stages of fabrication according to some embodiments.

FIG. 2 illustrates gate spacers 286 formed along sidewalls of the dummy gate structures 251 (e.g., sidewalls of the interfacial dielectrics 280, dummy gates 282, and masks 284) and over the fins 274. The gate spacers 286 may be formed by conformally depositing one or more layers for the gate spacers 286 and anisotropically etching the one or more layers, for example. The one or more layers for the gate spacers 286 may include a material different from the material(s) for the dummy gate structure 251. In some embodiments, the gate spacer 286 may include or be a dielectric material, such as silicon nitride, silicon oxynitride, silicon carbon nitride, the like, multi-layers thereof, or a combination thereof, and may be deposited by any suitable deposition technique.

Figure 3:
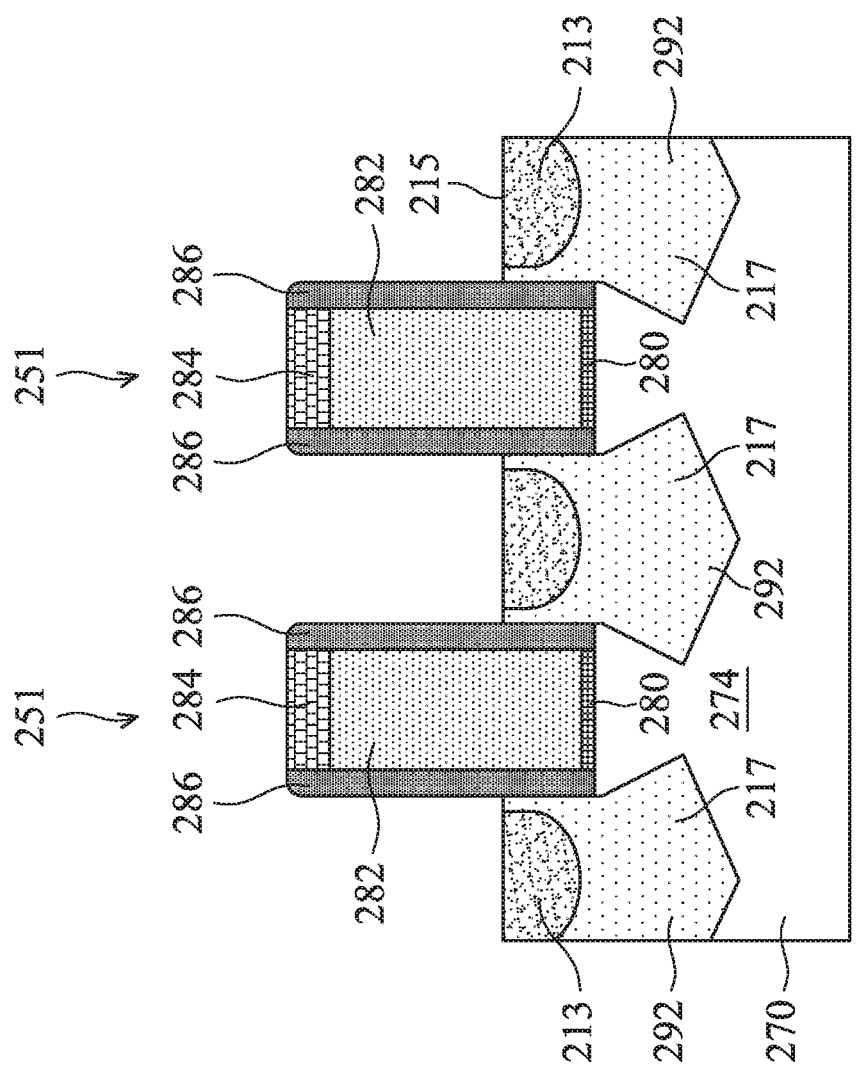

After the gate spacers 286 are formed, source/drain regions 292 may be formed in the fins 274 on opposing sides of the dummy gate structures 251, as shown in FIG. 3. In some examples, recesses can be etched in the fins 274 using the dummy gate structures 251 and gate spacers 286 as masks, and a material may be epitaxially grown in the recesses to form the source/drain regions 292. In some embodiments, the epitaxial source/drain structure may be a raised structure having a top surface higher than the original top surface of the fins 274. Additionally or alternatively, the source/drain regions 292 may be formed by implanting dopants into the fins 274 and/or the epitaxial source/drain regions 292 using the dummy gate structures 251 as masks.

Depending on the conductivity type of the transistor, the material for the source/drain regions 292 may be chosen to include or be silicon germanium ($Si_xGe_{1-x}$, where x can be between approximately 0 and 1), silicon carbide, silicon phosphorus, silicon carbon phosphorus, germanium, a III-V compound semiconductor, a II-VI compound semiconductor, or the like. For example, materials for forming a III-V compound semiconductor may include InAs, AlAs, GaAs, InP, GaN, InGaAs, InAlAs, GaSb, AlSb, AlP, GaP, and the like. In some examples, SiGe or Si may be included in the source/drain regions 292 for p-type devices (p-FETs) while SiCP or SiP may be included in the source/drain regions 292 for n-type devices (n-FETs). These source/drain regions 292 are designed to generate strain effect and thereby enhance carrier mobility to the nFET channel and pFET channel, respectively. The source/drain regions 292 may be raised with respect to the fin 274 and may have facets, which may correspond to crystalline planes of the semiconductor substrate 270.

Various embodiments discussed herein are to provide high surface dopant concentration for p-type devices and thus improve the device performance. While embodiments in this disclosure are focused on the p-type devices, it is contemplated that the concept is equally applicable to the n-type devices. In some embodiments, the source/drain regions 292 for p-type devices are silicon germanium ($Si_xGe_{1-x}$), and the concentration of germanium in SiGe is in a range of about 0 at. % to about 100 at. %, such as about 20 at. % to about 60 at. %, for example about 40 at. %. Having a high concentration of germanium (e.g., 20 at. % or more) in the SiGe can introduce strain into the transistor channel, thereby increasing mobility of holes and channel drive current. The concentration of the germanium portion may be a gradient along the thickness of the source/drain regions 292. For example, portions of the source/drain regions 292 towards a top surface 215 of the source/drain regions 292 may have a greatest concentration of germanium in the source/drain regions 292, and the concentration of germanium away from the top surface 215 may decrease as the thickness in the source/drain regions 292 increases. Therefore, the source/drain regions 292 can have at least a high Ge concentration region and a low Ge concentration region. In an embodiment shown in FIG. 3, the source/drain regions 292 for p-type devices have a first region 213 at or proximate the top surface 215 of the source/drain regions 292 and a second region 217 disposed radially outward of the first region 213, and the concentration of Ge decreases radially from the first region 213 to the second region 217. In some examples, the first region 213 may have a concentration of Ge in a range of about 20 at. % to about 100 at. %, for example about 40 at. % to about 80 at. %, with the remainder being silicon, and the second region 217 may have a concentration of Ge in a range of about 0 at. % to about 20 at. %, for example about 5 at. % to about 15 at. %, with the remainder being silicon.

Different germanium concentrations can be obtained by varying the germanium-containing precursor gas flow rates with a constant silicon-containing precursor gas flow during a process. Suitable silicon-containing precursor gas may include or be silane ($SiH_4$) or higher silanes with the empirical formula $Si_xH_{(2x+2)}$, such as disilane ($Si_2H_6$), trisilane ($Si_3H_8$), tetrasilane ($Si_4H_{10}$), or any combinations thereof. Suitable germanium-containing precursor gas may include or be germane ($GeH_4$), digermane ($Ge_2H_6$), or any combinations thereof. The source/drain regions 292 may be epitaxially formed using a chemical vapor deposition (CVD), a low-pressure chemical vapor deposition (LP-CVD), a reduced pressure chemical vapor deposition (RP-CVD), or the like.

Figure 4:
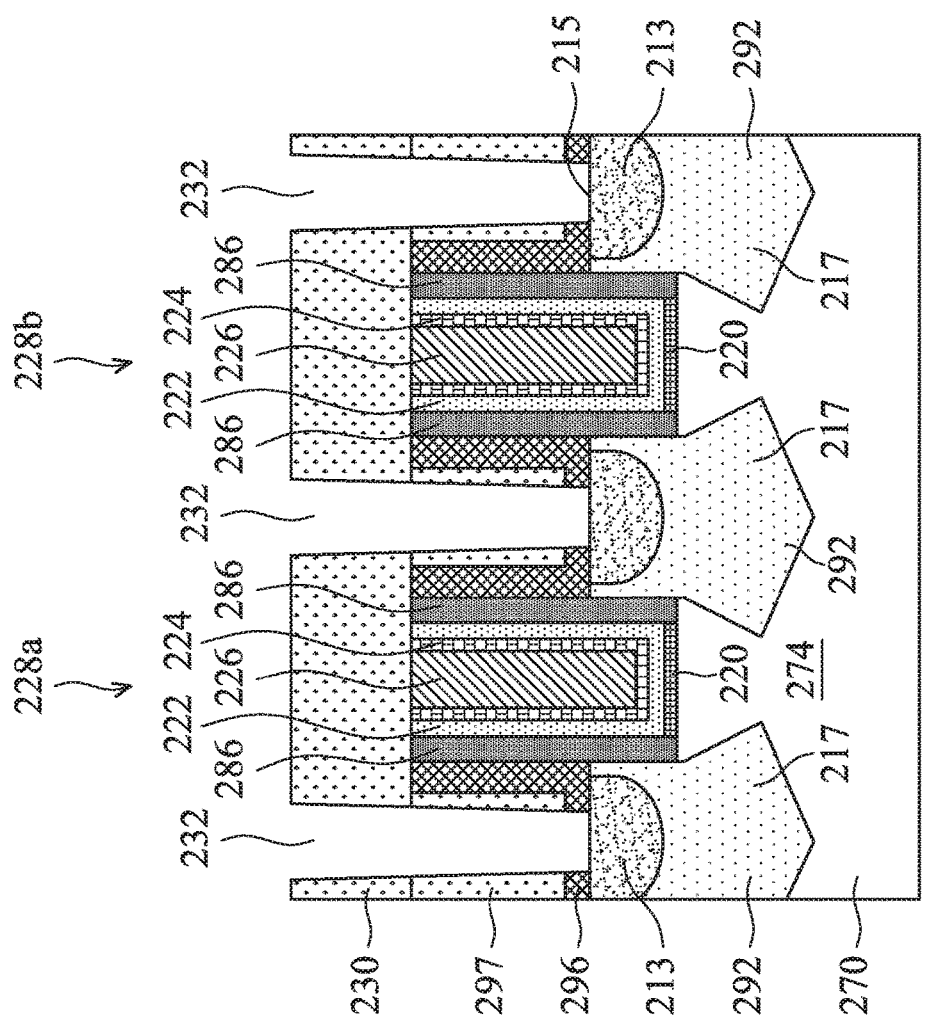

Referring to FIG. 4, a contact etch stop layer (CESL) 296 and a first interlayer dielectric (ILD) 297 are sequentially formed on surfaces of the source/drain regions 292, sidewalls and top surfaces of the gate spacers 286, top surfaces of the masks 284, and top surfaces of the isolation regions 278 using any suitable deposition technique. The CESL 296 is deposited conformally and may include or be silicon nitride, silicon carbon nitride, carbon nitride, the like, or a combination thereof. The first ILD 297 may include or be tetraethylorthosilicate (TEOS) oxide, silicon dioxide, a low-k dielectric material (e.g., a material having a dielectric constant lower than silicon dioxide), or the like. A chemical mechanical planarization (CMP) process may then be performed to planarize the first ILD 297 and the CESL 296 and to remove the masks 284 of the dummy gate structures 251, thereby leveling the top surface of the first ILD 297 and CESL 296 with the top surfaces of the dummy gates 282.

The dummy gate structures 251 are then removed using one or more etch processes. Upon removal of the dummy gate structures 251, recesses are formed between the gate spacers 286 where the dummy gate structures 251 are removed, and channel regions of the fins 274 are exposed through the recesses. The replacement gate structures 228a, 228b are then formed in the recesses where the dummy gate structures 251 were removed, as shown in FIG. 4. The replacement gate structures 228a, 228b each may include an interfacial dielectric 220, a gate dielectric layer 222, one or more optional conformal layers 224, and a gate fill conductive material 226. The interfacial dielectric 220 is formed on top surfaces of the fins 274 along the channel regions. The interfacial dielectric 220 can be an oxide (e.g., silicon oxide) formed by thermal or chemical oxidation of the fin 274, and/or an oxide (e.g., silicon oxide), nitride (e.g., silicon nitride), and/or another dielectric layer using any suitable deposition technique.

The gate dielectric layer 222 can be conformally deposited in the recesses where the dummy gate structures 251 were removed (e.g., on the interfacial dielectric 220, and sidewalls of the gate spacers 286) and on the top surfaces of the first ILD 297, the CESL 296, and gate spacers 286. The gate dielectric layer 222 can be or include silicon oxide, silicon nitride, a high-k dielectric material, multilayers thereof, or other dielectric material. A high-k dielectric material may have a k value greater than about 7.0, and may include a metal oxide of or a metal silicate of hafnium (Hf), aluminum (Al), zirconium (Zr), lanthanum (La), magnesium (Mg), barium (Ba), titanium (Ti), lead (Pb), multilayers thereof, or a combination thereof.

The one or more optional conformal layers 224 can include one or more barrier and/or capping layers and one or more work-function tuning layers. The one or more barrier and/or capping layers can include tantalum nitride, titanium nitride, the like, or a combination thereof. The one or more work-function tuning layer may include or be aluminum titanium carbide, aluminum titanium oxide, aluminum titanium nitride, the like, or a combination thereof. The materials for the one or more work-function tuning layer, the barrier layer and/or capping layer are selected so that a desired threshold voltage (Vt) is achieved for the transistor, which could be a p-type field effect transistor (pFET) or an n-type field effect transistor (nFET). A gate fill conductive material 226 is formed over the one or more conformal layers 224, if implemented, and/or the gate dielectric layer 222. The gate fill conductive material 226 can fill remaining recesses where the dummy gate structures 251 were removed. The gate fill conductive material 226 may be or include a metal-containing material such as tungsten, cobalt, aluminum, ruthenium, copper, multi-layers thereof, a combination thereof, or the like.

A planarization process, like a CMP, may remove portions of the gate fill conductive material 226, one or more conformal layers 224, and gate dielectric layer 222 above the top surfaces of the first ILD 297, the CESL 296, and gate spacers 286. The replacement gate structures 228a, 228b, each including the gate fill conductive material 226, one or more conformal layers 224, gate dielectric layer 222, and interfacial dielectric 220, may therefore be formed as illustrated in FIG. 4.

FIG. 4 further illustrates a second ILD 230 formed over the gate fill conductive material 226, one or more conformal layers 224, and gate dielectric layer 222, first ILD 297, gate spacers 286, and CESL 296. The second ILD 230 may include or be silicon dioxide, a low-k dielectric material, silicon oxynitride, PSG, BSG, BPSG, USG, FSG, OSG, $SiO_xC_y$, Spin-On-Glass, Spin-On-Polymers, silicon carbon material, a compound thereof, a composite thereof, the like, or a combination thereof.

After the second ILD 230 is formed, source/drain contact openings 232 are formed through the second ILD 230, the first ILD 297, and the CESL 296 to expose at least portions of the source/drain regions 292, as an example shown in FIG. 4. In some embodiments, the source/drain contact openings 232 may extend into the source/drain regions 292 to facilitate the generation of a metal contact that extends into/below the top surface of the source/drain regions 292. The second ILD 230, the first ILD 297, and the CESL 296 may be patterned with the openings 232, for example, using photolithography and one or more etch processes. The source/drain contact openings 232 allow making electrical contact to the source/drain regions 292 for the transistors.

Figure 5:
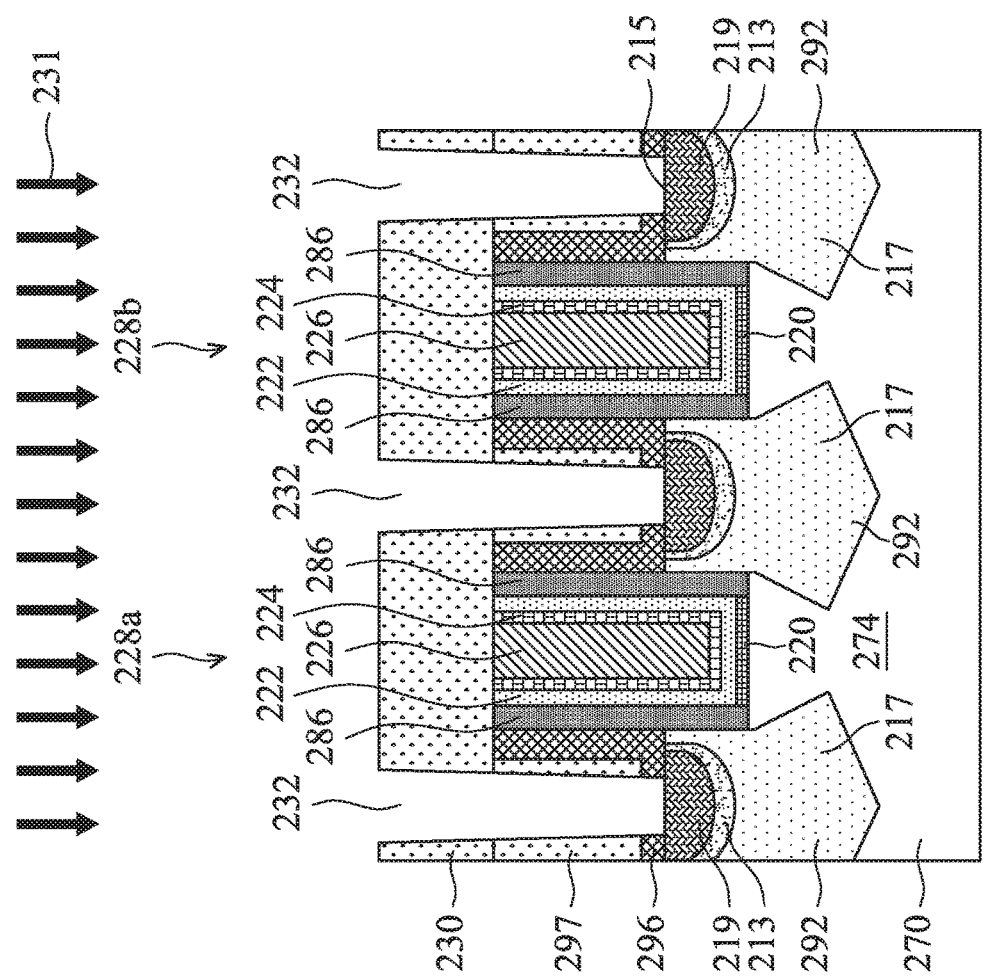

After the formation of the source/drain contact openings 232, a pre-amorphorized implantation (PAI) process 231 is performed to amorphize a portion of the exposed source/drain regions 292 where silicide regions are to be formed. The PAI process injects an impurity species into the source/drain regions 292 to form an amorphous region 219, as shown in FIG. 5. In some examples, the amorphous region 219 may have a depth from about 2 nm to about 20 nm, measuring from a top surface of the source/drain regions 292. In an embodiment, the PAI process is an ion implantation process which introduces first species into the exposed source/drain regions 292 such that at least a top portion of the source/drain regions 292 is converted into an amorphous structure. The amorphous regions 219 can prevent subsequently implanted dopants/impurities from channeling through the spaces between the crystal lattice structure and reaching depths greater than desired. Therefore, the subsequent dopants/impurities can be confined at a region within the amorphous regions 219 and/or proximate a top surface of the source/drain regions 292. As a result, a contact resistance between the source/drain regions 292 and a conductive feature that is subsequently formed can be greatly reduced.

In some embodiments, the first species to be implanted are group III element, such as gallium (Ga), indium (In), thallium (Tl), or a combination thereof. In an embodiment, the first species is $Ga^{66}$. The PAI process may be performed on the semiconductor substrate 270, using the second ILD 230, the first ILD 297, and/or the CESL 296 collectively as an implantation mask, so that the amorphous regions 219 are formed in the source/drain regions 292 exposed within the source/drain contact openings 232. The amorphous regions 219 generally have the first species (e.g., Ga) randomly distributed therein. In some embodiments, the PAI process may create a Gaussian distribution of the first species within the crystal lattice of the source/drain regions 292, with the peak or highest concentration of atoms being near the top surface 215 of the source/drain regions 292, and lower concentration deeper into the source/drain regions 292. In some examples, the gallium may have a peak concentration of about $1\times10^{22}$ A/cm$^3$ or greater at a vertical depth in a range from about 2 to about 6 nm, and the concentration gradient of gallium may decrease at a rate of about 1 decade per about 2.5 nm.

The PAI process using gallium (e.g., Ga$^{69}$) can have advantageous aspects. The PAI process using gallium as the first species can be advantageous in some applications because the atomic radius (e.g., size of an element) of gallium is greater than that of many doping atoms, such as boron, germanium, or silicon. Therefore, gallium may be less likely to diffuse deeply into the crystal lattice structure of silicon germanium. This allows the dopant profile to remain close to the as-implanted dopant profile after subsequent processing, such as after an anneal. This may permit more flexibility in processing for thermal budgets. For example, the dopant implant may be performed before various high temperature processes. In addition, gallium typically has higher solid solubility in germanium-based source/drain regions than other dopant species, such as boron, especially in the region having high concentration of germanium (e.g., the first region 213). The higher the dopant solubility is, the higher the amount of dopant activation can be achieved. Since the solubility of gallium in germanium is high and the diffusion behavior of gallium in germanium is slow even at higher temperatures (e.g., 650° C.), the pre-amorphorized implantation process can permit a high dopant concentration to be created proximate the top surface 215 of the source/drain region 292. Therefore, the PAI process can contribute more holes at the surface of the source/drain regions 292 for better carrier mobility. In addition, since gallium may be less prone to diffusing, short channel effects in a transistor, such as a FinFET, may be mitigated. Hence, the dopant tailing issue can be reduced for better control of the drain-induced barrier lowering (DIBL) effect. In some applications, a subsequent dopant implantation step can be eliminated since gallium is also a suitable dopant for p-type devices. Various dopant profiles after PAI process and thermal processes are further discussed below with respect to FIG. 10.

While gallium is discussed herein, it is contemplated that any chemical element that is greater in size than the host material (e.g., the substrate to be implanted) and has high solid solubility in the host material may also be used to cause the pre-amorphization of the surface of the source/drain regions 292.

An example PAI process using gallium atoms is discussed herein. The PAI process may include producing gallium ions and implanting gallium ions to the exposed source/drain regions 292. Gallium ions may be produced from any suitable gallium ion sources, which can be solid, liquid, or gas-based ion sources. In cases where a solid gallium source is desired, a solid gallium-containing target, such as gallium nitride, gallium oxide, gallium arsenide, or gallium phosphide, may be disposed in a plasma chamber. A plasma may be generated in the plasma chamber using an inert gas. The plasma ions are then accelerated toward and bombard the gallium-containing target to form gallium ions. The gallium ions are implanted into the exposed source/drain regions 292. If the dosage of gallium is too high, it may damage the channels and source/drain regions 292, causing various issues such as threshold voltage shifting and drain-induced barrier lowering (DIBL) degradation. If the dosage is too low, it may not form the shallow junction with the desired dopant concentration that can effectively change the contact resistance. The PAI process is designed with above considerations. In an example embodiment, gallium ions are implanted using an energy in a range between about 0.5 keV and about 20 keV, for example about 2 keV to about 6 keV, with a dosage in a range from about $1\times10^{15}$ atoms/cm$^2$ (A/cm$^2$) to about $2\times10^{16}$ A/cm$^2$. The temperature of the semiconductor substrate 270 during the PAI process can be maintained at a temperature in a range from about –150° C. to about 450° C., for example about –100° C. to about 30° C. In some examples, the temperature of the semiconductor substrate 270 during the PAI process is maintained at about –60° C. Gallium ions may be tilt implanted with a tilt angle between about 0 degree and about 40 degrees from a vertical, such as about 10 degrees to about 35 degrees, for example about 20 degrees.

It is understood that the parameters discussed herein can be tuned so that the implanted regions are effectively converted into amorphous regions regardless of the first species used. In addition, while the amorphous regions 219 are shown as being confined within the boundary of the first region 213, in some embodiments the amorphous regions 219 may extend over the first region 213. The depth of the amorphous regions 219 may vary depending upon the application, and can be controlled by changing the implantation energy, substrate temperature and/or the tilt angle.

After the amorphous regions 219 are formed in the exposed source/drain regions 292, a dopant implantation process may be performed to introduce a second species (e.g., dopants) to the exposed source/drain regions 292. The dopant implantation process is designed to further reduce the contact resistance to the source/drain regions 292. The contact resistance between the source/drain regions 292 and a conductive feature that is subsequently formed can be effectively reduced due to the characteristics of the second species. Particularly, due to the presence of large number of dangling bonds and random distribution of the first species (e.g., Ga) having a large atomic size in the amorphous regions 219, the majority of the second species can be trapped or confined within the amorphous regions 219. As a result, the dopant activation at the surface of the source/drain regions 292 can be greatly improved, and hence, further reduce the contact resistance for the devices.

For p-type devices, the second species may include boron, aluminum, gallium, indium, or any combination thereof. In an embodiment, the second species is boron. In some cases, the second species may also include n-type dopants such as phosphorous, arsenic, antimony, etc. The dopant implantation process can be optional if the first species used in the PAI process provide desired and/or suitable conductivity for the device.

Figure 6:
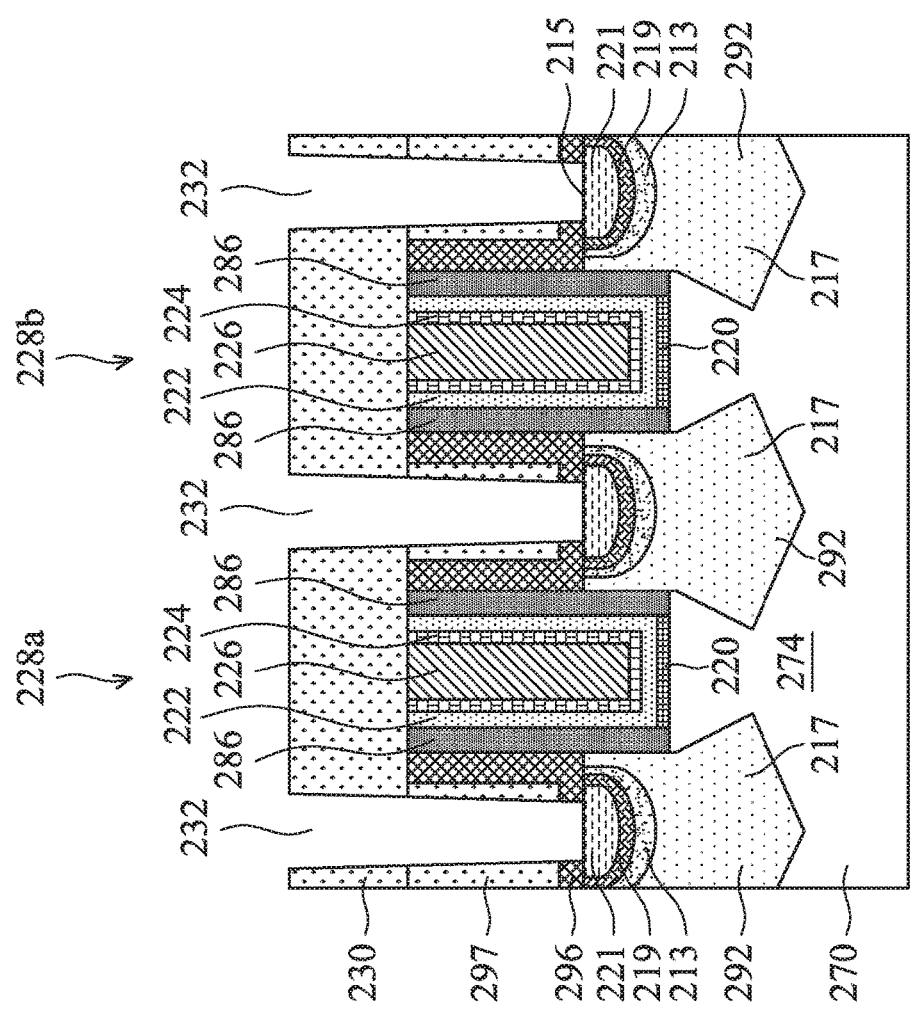

The second species are implanted into substantially the same regions as the first species using an ion implantation process, thereby forming a doped region 221 in the exposed source/drain regions 292, as shown in FIG. 6. The doped regions 221 may overlap the amorphous regions 219, meaning the second species may be randomly distributed in the amorphous regions 219 containing the first species. In some embodiments, the dopant implantation process may create a distribution of the second species within the amorphous regions 219, with the peak or highest concentration of second species being near the top surface 215 of the source/drain regions 292, and lower concentration deeper into the amorphous regions 219 (or source/drain regions 292). In an embodiment, the second species has a peak concentration equal to or greater than about $1\times10^{21}$ A/cm$^3$ at a vertical depth in a range between about 2 nm to about 4 nm, and the concentration of the second species decreases in the source/drain region from the peak concentration of the second species in a direction away from the top surface 215 of the source/drain region. The depth of the doped regions 221 can be controlled by changing the implantation energy, substrate temperature, and/or the tilt angle. While the amorphous regions 219 may generally have a greater, deeper distribution within the source/drain regions 292 than that of the doped regions 221, in some embodiments the doped regions 221 may extend over the boundary of the amorphous regions 219 to a region between the boundary of the amorphous region 219 and the boundary of the first region 213. In some embodiments, the doped regions 221 may further extend into the second region 217. In most cases, the diffusion of the dopants can be further increased by the subsequent annealing processes.

In an example embodiment, the second species (e.g., boron) is implanted using an energy in a range between about 0.5 keV and about 10 keV, with a dosage in a range from about $1\times10^{12}$ A/cm$^2$ to about $1\times10^{16}$ A/cm$^2$, for example about $1\times10^{15}$ A/cm$^2$. If desired, the p-type dopant may be tilt implanted with a tilt angle in a range between about 0 degree and about 30 degrees from vertical.

Figure 7:
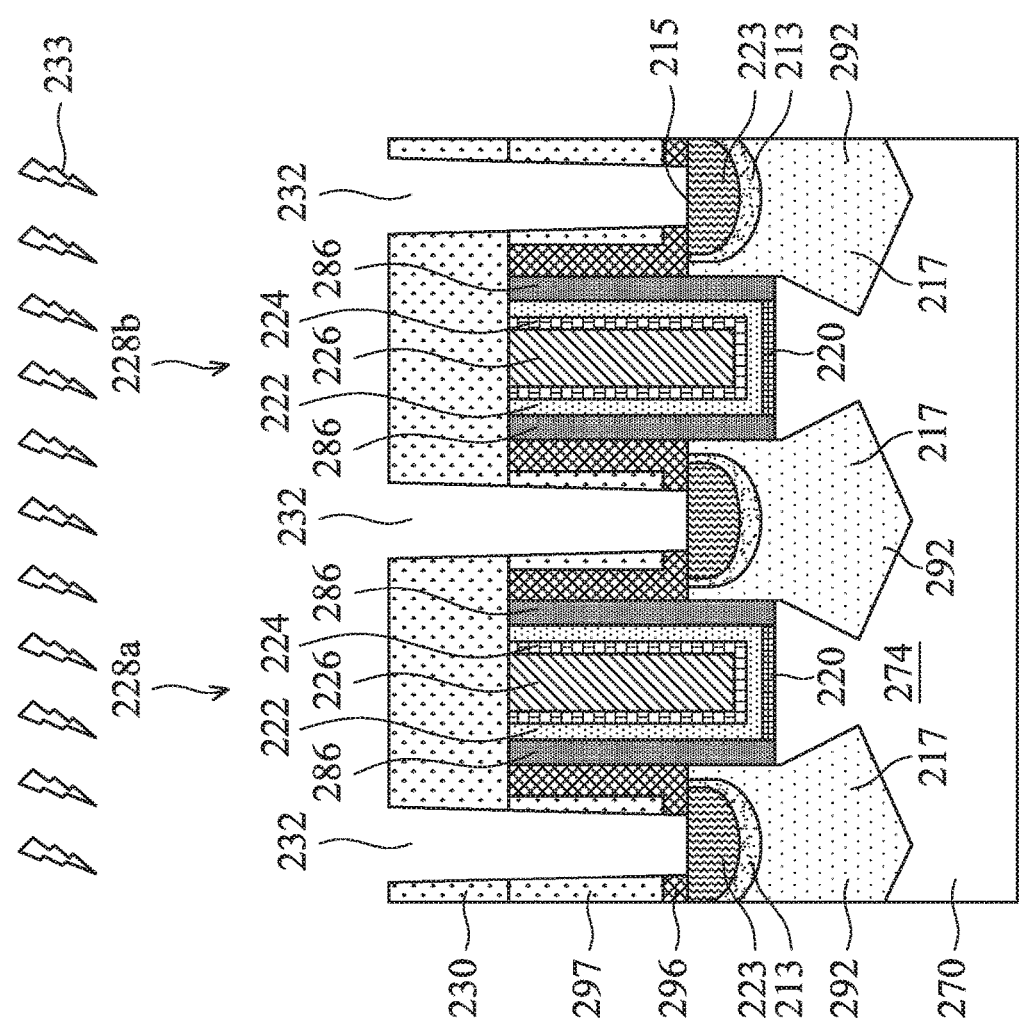

After the optional dopant implantation process, a thermal treatment 233 is performed to activate the dopants in the source/drain regions 292. The thermal treatment 233 may further re-crystallize any of the source/drain regions that were amorphous. For example, the thermal treatment 233 may reorder the crystal structure of the amorphous regions 219, re-distribute the dopant atoms (e.g., first and second species) by incorporating the dopant atoms into the crystalline lattice of the source/drain regions 292. Ordering the crystal lattice and activating dopants can reduce resistivity of the doped regions. Upon completion of the thermal treatment 233, the amorphous regions 219 can turn into crystalline regions 223, as shown in FIG. 7. The crystalline regions 223 may have the first species and the second species randomly redistributed therein. In some embodiments, the crystalline regions 223 may have a peak or higher concentration of the first species and the second species proximate the top surface 215 of the source/drain regions 292, and a lower concentration (e.g., an order magnitude lower than the peak concentration) of the first species and the second species deeper into the crystalline regions 223 (e.g., towards a direction away from the top surface 215). In an example, the crystalline regions 223 may be silicon germanium doped with first and second species. In cases where the first species is gallium and the second species is boron, the crystalline regions 223 may be gallium-doped and/or boron-doped silicon germanium.

In an embodiment, the thermal treatment 233 is a millisecond annealing (MSA) process. In some embodiments, the MSA process utilizes a laser anneal process to achieve the annealing times in the range of milliseconds. Performing annealing process on millisecond scale can be advantageous because such extremely short annealing treatment can activate the dopants (e.g., first and second species) in the source/drain regions 292 with minimized diffusion of the dopants from the source/drain regions 292 even at high annealing temperature (e.g., 850° C. or above). Since the dopants in the source/drain regions 292 are activated with minimal diffusion, short channel effect can be prevented. An example chamber for performing the laser anneal process is Astra DSA® chamber available from Applied Materials, Inc. of Santa Clara, Calif. It is contemplated that a flash lamp annealing process or any advanced process using suitable optical radiation for performing an anneal for a very short amount of time, e.g., on a millisecond time scale, may also be used.

The laser anneal process may be performed by scanning a laser beam from an energy source across the exposed surface of the source/drain regions 292. The laser beam may be applied/scanned sequentially to portions of the source/drain regions 292. For example, the laser beam may anneal a first portion of the source/drain region 292, then the semiconductor substrate 270 and/or laser beam may be moved, and the laser beam may anneal a second portion of the source/drain region 292. The energy source may be any type of laser such as gas laser, excimer laser, solid-state laser, fiber laser, semiconductor laser, etc. The laser beam may have a constant energy flux. The laser beam may be delivered to the exposed surface of the source/drain regions 292 while the semiconductor substrate 270 is translated, or scanned, relative to the energy (or vice versa) delivered to the surface of the source/drain regions 292. In either case, the laser scan rates may be in a range from about 15 mm/second to about 650 mm/second, which may vary depending upon the desired dwell times of the application. The laser beam may be operated at a desired range of wavelengths and intensities. In some embodiments, the laser beam may have a wavelength in a range from about 200 nm to about 20 micrometers, such as from about 700 nm to about 1200 nm, for example about 950 nm to about 1000 nm, and an energy density in a range from about 0.1 W/cm$^2$ to about 10 W/cm$^2$. The laser anneal process can be performed so that each portion having the laser beam incident thereon can be momentarily elevated to a temperature of about 800° C. or greater, such as about 850° C. or greater, for example in a range from about 900° C. to about 1200° C. During the laser anneal process, the chamber pressure may be maintained at about 10 Torr to about 850 Torr. The dwell time of the laser beam may be in a range from about 0.01 milliseconds to about 10 milliseconds, such as about 0.5 milliseconds to about 5 millisecond, for example 0.1 milliseconds to 3 milliseconds.

In another embodiment, the thermal treatment 233 is a rapid thermal anneal (RTA) process followed by a millisecond annealing (MSA), such as the MSA process discussed above. In this embodiment, the RTA process may recrystallize or repair the lattice structure of the amorphous regions 219 due to the gallium implant in the source/drain regions 292. The subsequent MSA process then reorders or re-distributes the dopant atoms (e.g., first and second species) for activation of the dopants. Since the MSA process is performed in the range of milliseconds, the dopants can be activated with minimal diffusion out of the source/drain regions 292. The RTA process may be performed by heating the intermediate structure of FIG. 7 using lamps, such as an array of halogen lamps or flash lamps. An example embodiment using a halogen lamp annealing process may include heating and maintaining the intermediate structure of FIG. 7 to a temperature of about 200° C. or above, for example in a range from about 250° C. to about 350° C. Then light of a halogen lamp is irradiated on the exposed surface of the intermediate structure of FIG. 7 in a range from about 1 second to about 600 seconds, such as about 10 seconds to about 180 seconds, to further heat the surface of the intermediate structure of FIG. 7, for example the top surface 215 of the source/drain regions 292, to a temperature in a range from about 400° C. to about 800° C., such as about 550° C. to about 700° C. In some embodiments, the RTA process may be performed after the MSA process.

After the thermal treatment 233, silicide layers are formed on the source/drain regions 292. Silicide layers are formed to reduce the contact resistance for the device. In some embodiments, the silicide layers may be formed by forming a metal (such as titanium or tantalum) on at least the exposed surfaces of the source/drain regions 292, and annealing to react the metal with the material of the source/drain regions 292 to form silicide layers.

Figure 8:
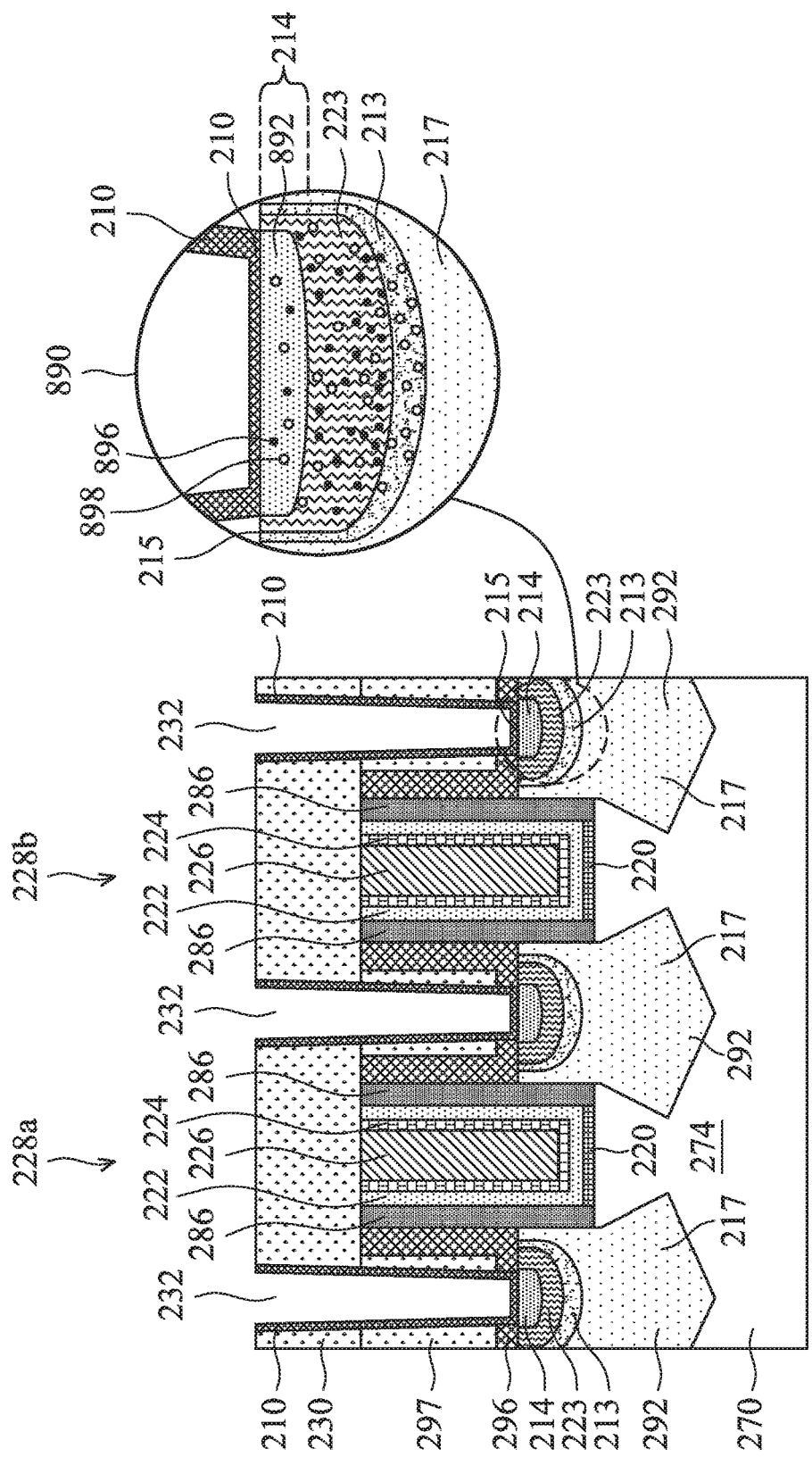

In an embodiment, a conformal metal layer 210 is formed on the surfaces of the exposed source/drain regions 292 and over the surfaces of the second ILD 230, the first ILD 297, and the CESL 296, as shown in FIG. 8. The metal layer 210 may be a single layer or a multi-layer stack. In cases where a single layer is adapted for the metal layer 210, the metal layer 210 may be or include titanium, tantalum, or the like. In cases where a multi-layer stack (e.g., a bi-layer) is adapted for the metal layer 210, a first layer may be or include titanium, tantalum, or the like, and a second layer may be or include titanium nitride, titanium oxide, tantalum nitride, tantalum oxide, or the like. The first layer may be formed on the second layer, or vice versa. The metal layer 210 may be deposited by ALD, physical vapor deposition (PVD), CVD, or any suitable deposition technique. In some cases where a bi-layer is used, the first layer may be formed by PVD and the second layer may be formed by ALD. In some embodiments, the metal layer 210 is a Ti layer. In another embodiment, the metal layer 210 is a layer stack having a TiN layer formed on a Ti layer.

After the metal deposition, an annealing process is performed to react an upper portion of the source/drain regions 292 with the metal layer 210, thereby forming silicide layers 214, as shown in FIG. 8. The substrate 270 is heated to cause the silicide reaction to occur wherever the metal layer 210 is in contact with the source/drain regions 292. The silicide reaction may occur at an interface between the source/drain regions 292 and the metal layer 210, and a region around and/or beyond the interface between the source/drain regions 292 and the metal layer 210. In some cases where a layer stack (e.g., Ti/TiN) is used for the metal layer 210, the bottom layer (e.g., Ti) may react with the source/drain region 292 and convert fully into a first silicide region. A portion of the first silicide region may overlap the crystalline regions 223. Inset 890 in FIG. 8 is an enlarged partial view showing an example of the silicide layers 214 having a silicide region 892 formed at the interface between the source/drain regions 292 and the metal layer 210. In an example where the metal layer 210 is Ti/TiN layer stack, the silicide region 892 may be Ti silicide (e.g., TiSiGe). The silicide regions 892 may contain and/or be surrounded by first species 896 (e.g., Ga) and second species 898 (e.g., B). The first and second species 896, 898 are exaggerated in inset 890 for ease of understanding. In some cases, the second species 898 are largely distributed in the crystalline region 223 due to the presence of large number of dangling bonds and random distribution of the first species 896 (e.g., Ga) having a large atomic size in the crystalline region 223. In some embodiments, the first and second species 896, 898 may be randomly distributed along an interface between the silicide layer 214 and the crystalline region 223. In some embodiments, the first and second species 896, 898 may be randomly distributed in the silicide regions 892. In some embodiment, the first and second species 896, 898 may be gradually distributed in the first silicide regions 892 along the thickness of the source/drain regions 292, with the peak or higher concentration of first and second species 896, 898 being near the top surface 215 of the source/drain regions 292, and lower concentration (e.g., at least an order of magnitude lower than the peak concentration) deeper into the source/drain regions 292.

The anneal process used during the silicide formation can be, for example, a rapid thermal anneal (RTA) performed at a temperature in a range from about 400° C. to about 650° C., such as about 500° C., for a duration in a range from about 5 seconds to about 60 seconds. The silicide layer 214 may have a thickness in a range from 2 nm to about 20 nm, for example. In some examples, the un-reacted metal layer 210 can be removed by a selective etch process that attacks non-reacted metal layer 210 but does not attack the silicide layer 214. The selective etch process may be any suitable wet etch or a dry etch process. In some examples, the un-reacted metal layer 210 can be used to form an adhesion layer and/or barrier layer.

Figure 9:
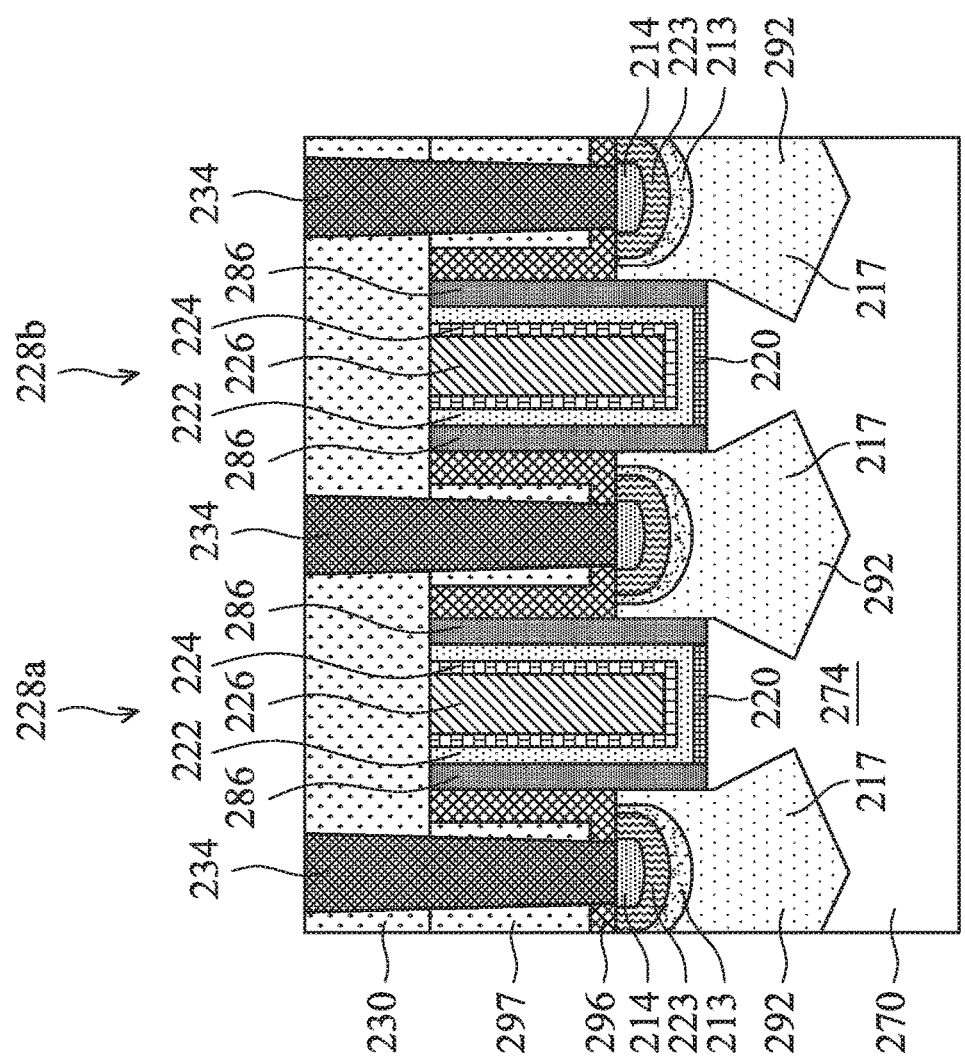

FIG. 9 illustrates the formation of conductive features 234 in the source/drain contact openings 232 to the source/drain regions 292. Each conductive feature 234 may include a conformal adhesion layer formed in the exposed surfaces of the source/drain contact openings 232, a barrier layer on the adhesion layer, and conductive material on the barrier layer, for example. In some embodiments, a liner layer, such as a dielectric spacer liner (DSL), may be provided over the exposed surfaces of the source/drain contact openings 232 and extended into the source/drain regions 292. In such a case, the barrier layer may be disposed inner of the DSL. The DSL defines a bottom hole at the source/drain regions 282 that enable access thereto. In some embodiments, the DSL may extend into the source/drain regions 292 at a different depth than the barrier layer. In some embodiments, the DSL may extend into the source/drain regions 292 deeper than that of the barrier layer. Suitable material for the DSL may include, but is not limited to, silicon oxycarbide (SiOC), silicon oxynitride (SiON), silicon dioxide ($SiO_2$), silicon nitride (SiN), and combinations thereof. The adhesion layer may be or include titanium, tantalum, the like, or a combination thereof, and may be deposited by ALD, CVD, or another deposition technique. The barrier layer may be or include titanium nitride, titanium oxide, tantalum nitride, tantalum oxide, the like, or a combination thereof, and may be deposited by ALD, CVD, or another deposition technique. The conductive material can be deposited on the barrier layer and fill the source/drain contact openings. The conductive material may be or include tungsten, cobalt, copper, ruthenium, aluminum, gold, silver, alloys thereof, the like, or a combination thereof, and may be deposited by CVD, ALD, PVD, or another deposition technique. After the conductive material is deposited, excess conductive material, barrier layer, and adhesion layer may be removed by using a planarization process, such as a CMP, for example. Hence, top surfaces of the conductive features and the second ILD 230 may be coplanar. The conductive features 234 may be referred to as contacts, plugs, etc.

Figure 10:
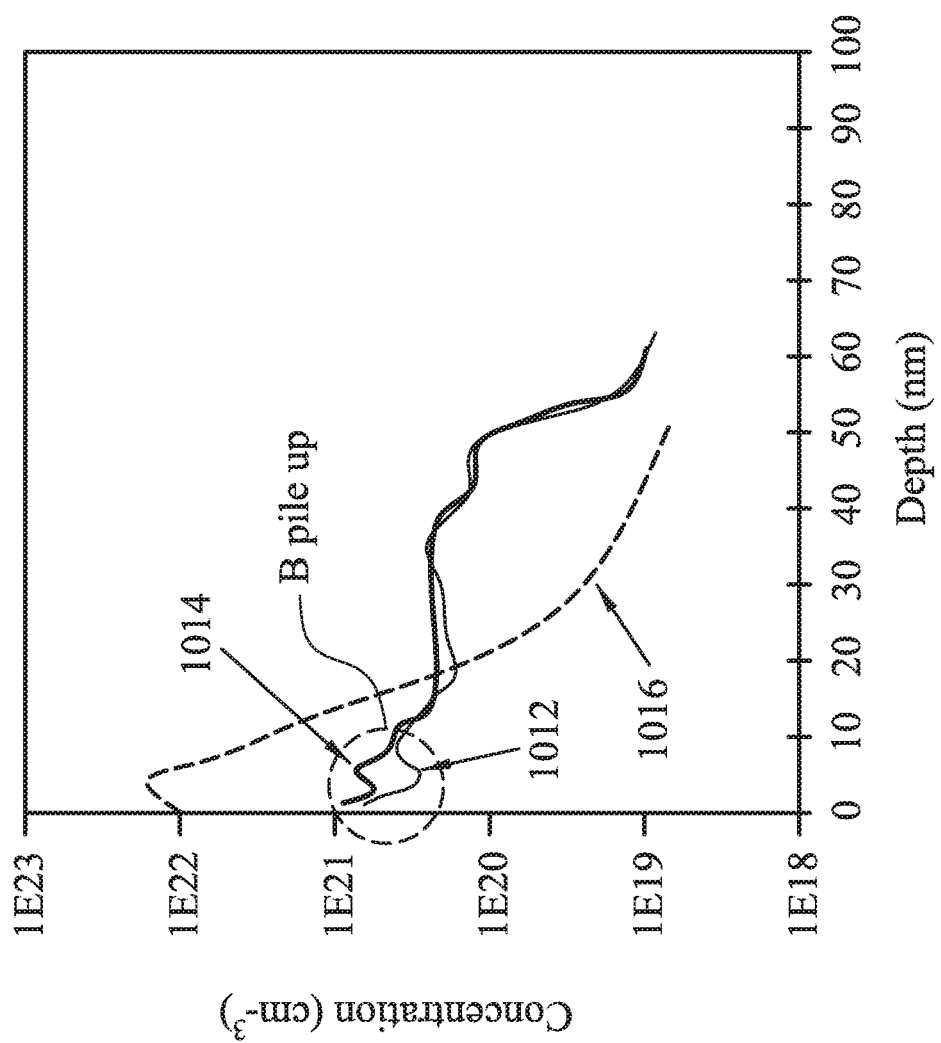
FIG. 10 is a graph illustrating various dopant profiles in accordance with some embodiments.

FIG. 10 is a graph illustrating various dopant profiles after the PAI process and thermal processes in accordance with some embodiments. The graph illustrates dopant concentration as a function of depth (e.g., vertical depth) from a top surface of, for example, the source/drain regions 292 into the source/drain region 292. The graph illustrates a first profile 1012 of boron concentration, which is formed by a pre-amorphorized implantation process that includes a boron implant followed by a gallium implant. The graph illustrates a second profile 1014 of boron concentration, which is formed by a pre-amorphorized implantation process that includes a gallium implant followed by a boron implant. The graph further illustrates a third profile 1016 of gallium concentration, which is formed by a pre-amorphorized implantation process that includes a gallium implant and by a boron implant that can is performed before or after the gallium implant. For purposes of illustration, the intrinsic material of the source/drain region is SiGe. Gallium was implanted at a temperature of about −60° C. during the pre-amorphorized implantation for the profiles 1014 and 1016. The thermal processes for the profiles 1012, 1014, and 1016 include a rapid thermal anneal at 700° C. for 90 seconds.

As can be seen in the second profile 1014, when gallium was used to amorphize the source/drain region, boron has a greater concentration (pile up) at a depth in a range from about 2 to about 4 nm than the first profile 1012 where boron was first used to amorphize the source/drain region. The second profile 1014 suggests that boron dopants are largely trapped in the amorphous regions due to the presence of implanted gallium from the PAI process. Therefore, when gallium was implanted preceding the dopant (e.g., boron) implant, a higher dopant concentration can be created proximate the surface of the source/drain region. The third profile 1016 shows gallium has a peak concentration of about $1\times10^{22}$ A/cm$^3$ at or proximate the surface of the source/drain region (at a depth in a range from about 1 to about 3 nm) due to its larger size on an atomic scale and higher solid solubility in germanium.

Figure 11:
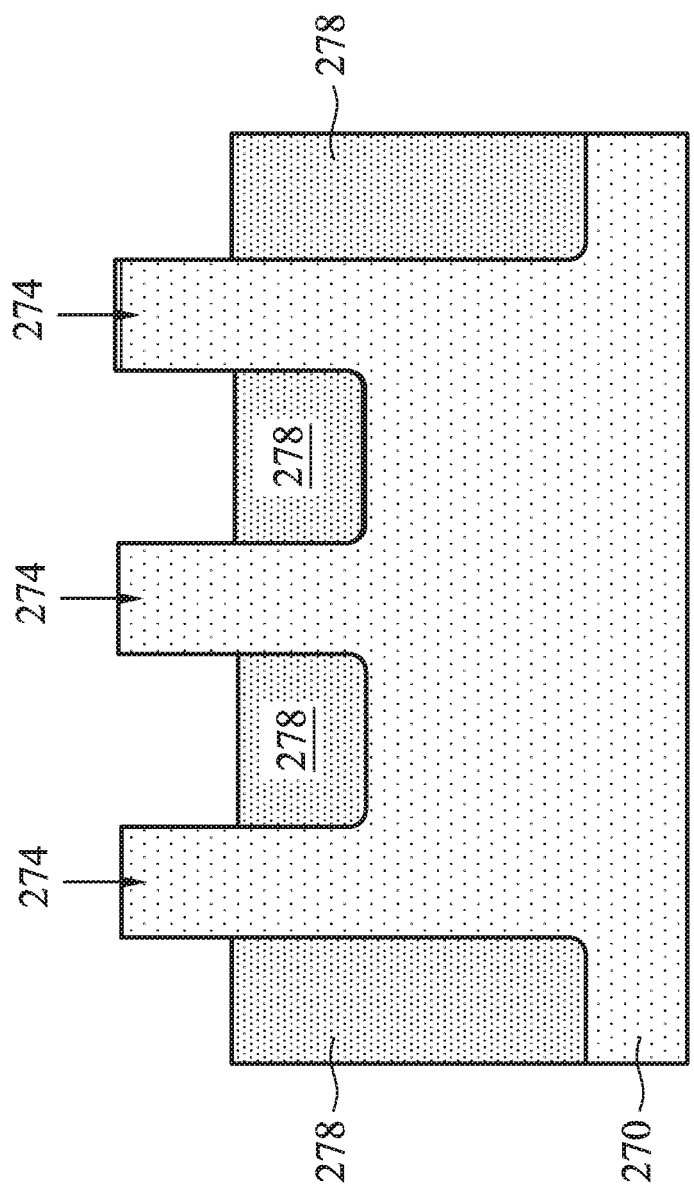
FIG. 11 is a cross-sectional view of a portion of an example device structure in accordance with some embodiments.

While the device structures may vary in different embodiments, it is contemplated that various embodiments in this disclosure can be applied to FinFETs having fins on a crown structure. FIG. 11 illustrates a cross-sectional view of a portion of a device structure in accordance with some embodiments. The structure of FIG. 11 may be referred to as a "crown" structure, whereas the structure of, e.g., FIG. 1 may be referred to as a "non-crown" structure. As depicted in FIG. 11, the lower surfaces of the isolation regions 278 may be at varying levels. This may be obtained during patterning the semiconductor substrate 270 in forming the fins 274, such as by two or more patterning and etching processes.

Various embodiments described herein allow formation of a high dopant concentration at surface of source/drain regions for p-FET devices by using gallium for amorphizing at least a portion of the source/drain regions before implanting a second dopant, such as boron. Gallium has higher solid solubility than boron in germanium, especially in silicon germanium having high concentration of germanium of about 40 at. % or greater. Hence, gallium may have a higher activation, and hence, contribute more holes, in comparison to other dopants, for better carrier mobility. Also, the amorphous regions created by the gallium implants can help trap subsequently implanted dopant implants at the surface of the source/drain regions, thereby reducing a contact resistance between the source/drain regions and a conductive feature that is subsequently formed. In addition, since gallium is less prone to diffusing due to its larger size on an atomic scale, implanting gallium in silicon germanium can permit a high dopant concentration to be created proximate the top surface of the source/drain region. Therefore, the dopant tailing issue can be reduced for better control of the drain-induced barrier lowering (DIBL) effect. Furthermore, since gallium is also a suitable dopant for p-type devices, in some applications the needs of a subsequent dopant implantation step can be eliminated.

In an embodiment, a method for semiconductor processing is provided. The method includes forming a source/drain region in an active area on a substrate, the source/drain region comprising germanium, performing an ion implantation process using gallium (Ga) to form an amorphous region in the source/drain region, performing an ion implantation process using a dopant into the amorphous region, and subjecting the amorphous region to a thermal process.

In another embodiment, a method for semiconductor processing is provided. The method includes forming a source/drain region in an active area on a substrate, the source/drain region comprising germanium having a concentration of about 20 atomic percent (at. %) or greater, forming a dielectric layer over the active area, forming an opening through the dielectric layer to expose at least a portion of an upper surface of the source/drain region, implanting a first species comprising gallium into the exposed source/drain region, after implanting the first species, implanting a second species comprising a p-type dopant into the exposed source/drain region, subjecting the exposed source/drain region to a first anneal process operating at a first temperature window for a first duration, after the first anneal process, subjecting the exposed source/drain region to a second anneal process operating at a second temperature window for a second duration, the second temperature being higher than the first temperature window and the second duration being shorter than the first duration, forming a silicide region at the upper surface of the exposed source/drain region, and forming a conductive feature in the opening to the upper surface of the source/drain region.

In yet another embodiment, a structure is provided. The structure includes an active area on a substrate, the active area comprising a source/drain region, the source/drain region having a silicide layer disposed thereon, a dielectric layer over the active area, and a conductive feature through the dielectric layer to the active area and contacting the source/drain region at the silicide layer. The source/drain region includes a first region proximate a top surface of the source/drain region and overlapped with at least a portion of the silicide layer, the first region having a first concentration of germanium, the first region comprising gallium, a peak concentration of gallium being proximate the top surface of the source/drain region, a concentration of gallium decreasing in the source/drain region from the peak concentration of gallium in a direction away from the top surface of the source/drain region, and a second region disposed between the first region and the substrate, the second region having a second concentration of germanium lower than the first concentration of germanium.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for semiconductor processing, the method comprising:

forming a source/drain region in an active area on a substrate, the source/drain region comprising germanium;

performing a first ion implantation process using gallium (Ga) to form an amorphous region in the source/drain region;

after performing the first ion implantation process, performing a second ion implantation process using a dopant into the amorphous region;

after performing the second ion implantation process, subjecting the amorphous region to a thermal process to form a crystalline region; and after subjecting the amorphous region to the thermal process, forming a silicide region over the crystalline region.

2. The method of claim 1, wherein the source/drain region is silicon germanium (SiGe), and germanium is in a range of about 20 atomic percent (at. %) to about 80 at. %.

3. The method of claim 1, wherein ion implantation process using gallium (Ga) implants with a dosage of gallium in a range between about $1 \times 10^{15}$ A/cm² and about $2 \times 10^{16}$ A/cm².

4. The method of claim 1, wherein the first ion implantation process is performed at a temperature in a range from about −100° C. to about 30° C.

5. The method of claim 1, wherein the dopant is a p-type dopant.

6. The method of claim 1, wherein the dopant includes boron.

7. The method of claim 1, wherein the thermal process includes a laser anneal process using a laser beam having a dwell time in a range from about 0.5 milliseconds to about 5 milliseconds.

8. A method for semiconductor processing, the method comprising:

forming a source/drain region in an active area on a substrate, the source/drain region comprising germanium having a concentration of about 20 atomic percent (at. %) or greater;

forming a dielectric layer over the active area;

forming an opening through the dielectric layer to expose at least a portion of an upper surface of the source/drain region;

implanting a first species comprising gallium into the exposed source/drain region;

after implanting the first species, implanting a second species comprising a p-type dopant into the exposed source/drain region;

after implanting the second species, subjecting the exposed source/drain region to a first anneal process operating at a first temperature window for a first duration;

after the first anneal process, subjecting the exposed source/drain region to a second anneal process operating at a second temperature window for a second duration, the second temperature window being higher than the first temperature window and the second duration being shorter than the first duration;

after subjecting the exposed source/drain region to a second anneal process, forming a silicide region at the upper surface of the exposed source/drain region; and forming a conductive feature in the opening to the upper surface of the source/drain region.

9. The method of claim 8, wherein the source/drain region is silicon germanium (SiGe), and the concentration of germanium is in a range from about 40 at. % to about 80 at. %.

10. The method of claim 8, wherein the exposed source/drain region is implanted with a dosage of the first species in a range from about $1 \times 10^{15}$ A/cm² to about $2 \times 10^{16}$ A/cm².

11. The method of claim 8, wherein the first species are implanted in a temperature range from about −150° C. to about 450° C.

12. The method of claim 11, wherein the first species are implanted in a temperature range from about −100° C. to about 30° C.

13. The method of claim 8, wherein the first species are implanted using an energy in a range between about 0.5 keV and about 20 keV and a tilt angle between about 10 degrees to about 35 degrees.

14. The method of claim 8, wherein the first anneal process includes a rapid thermal anneal process, and the first temperature window is in a range from about 400° C. to about 800° C. and the first duration is in a range from about 1 second to about 600 seconds, and the second anneal process includes a laser anneal process, and the second temperature window is in a range from about 900° C. to about 1200° C. and the second duration is in a range from about 0.5 milliseconds to about 5 milliseconds.

15. A method for semiconductor processing, the method comprising:

forming a source/drain region in an active area on a substrate, the source/drain region comprising germanium;

amorphizing an amorphized portion of the source/drain region;

after amorphizing, implanting a first dopant comprising a p-type dopant into the source/drain region;

after implanting the first dopant, performing a first anneal at a first temperature; and after performing the first anneal, performing a second anneal at a second temperature, wherein the first anneal is a different type of anneal than the second anneal, wherein after performing the second anneal, a doped area having the first dopant is larger than an area of the amorphized portion.

16. The method of claim 15, wherein the first dopant comprises a p-type dopant.

17. The method of claim 15, wherein amorphizing the amorphized portion of the source/drain region is performed by implanting gallium.

18. The method of claim 15, wherein the first anneal comprises a millisecond anneal and the second anneal comprises a rapid thermal anneal.

19. The method of claim 15 further comprising, after performing the second anneal, forming a silicide region on the source/drain region.

20. The method of claim 19, wherein the silicide region is contained within the doped area.

* * * * *